US009754817B2

(12) United States Patent
Lee et al.

(10) Patent No.: US 9,754,817 B2
(45) Date of Patent: Sep. 5, 2017

(54) SEMICONDUCTOR STRUCTURES HAVING AN INSULATIVE ISLAND STRUCTURE

(71) Applicant: Samsung Electronics Co., Ltd., Suwon-si, Gyeonggi-do (KR)

(72) Inventors: Kil-Ho Lee, Hwaseong-si (KR); Se-Woong Park, Seoul (KR); Ki-Joon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 15/170,043

(22) Filed: Jun. 1, 2016

(65) Prior Publication Data

US 2016/0329236 A1 Nov. 10, 2016

Related U.S. Application Data

(62) Division of application No. 14/053,932, filed on Oct. 15, 2013, now Pat. No. 9,379,003.

(30) Foreign Application Priority Data

Oct. 25, 2012 (KR) ........................ 10-2012-0119210

(51) Int. Cl.
*H01L 21/02* (2006.01)
*H01L 21/30* (2006.01)
(Continued)

(52) U.S. Cl.
CPC .... *H01L 21/7681* (2013.01); *H01L 21/76804* (2013.01); *H01L 21/76808* (2013.01);
(Continued)

(58) Field of Classification Search
CPC ......... H01L 21/02; H01L 21/30; H01L 29/06; H01L 33/00; H01L 27/10; H01L 28/90
See application file for complete search history.

(56) References Cited

U.S. PATENT DOCUMENTS 6,348,414 B1   2/2002   Yun et al.
7,498,181 B2   3/2009   Klibanov et al.
(Continued)

FOREIGN PATENT DOCUMENTS

JP    2008-251846      10/2008
KR    100167455 B1     9/1998
(Continued)

*Primary Examiner* — Allen Parker
*Assistant Examiner* — Ismail Muse
(74) *Attorney, Agent, or Firm* — Myers Bigel, P.A.

(57) ABSTRACT

A semiconductor device and methods of forming a semiconductor device are disclosed. In the methods, a layer, such as an insulating interlayer, is formed on a substrate. A first trench is formed in the layer, and a mask layer is formed in the first trench. The mask layer has a first thickness from a bottom surface of the first trench to the top of the mask layer. The mask layer is patterned to form a mask that at least partially exposes a sidewall of the first trench. A portion of the mask adjacent to the exposed sidewall of the first trench has a second thickness smaller than the first thickness. The layer is etched to form a second trench using the mask as an etching mask. The second trench is in fluid communication with the first trench. A conductive pattern is formed in the first trench and the second trench.

7 Claims, 13 Drawing Sheets

(51) Int. Cl.
  *H01L 29/06* (2006.01)
  *H01L 33/00* (2010.01)
  *H01L 27/10* (2006.01)
  *H01L 21/768* (2006.01)
  *H01L 23/528* (2006.01)
  *H01L 23/522* (2006.01)
  *H01L 23/532* (2006.01)

(52) U.S. Cl.
  CPC .. *H01L 21/76816* (2013.01); *H01L 21/76843* (2013.01); *H01L 21/76879* (2013.01); *H01L 23/5226* (2013.01); *H01L 23/5283* (2013.01); *H01L 23/53238* (2013.01); *H01L 23/53295* (2013.01); *H01L 2924/0002* (2013.01)

(56) References Cited

U.S. PATENT DOCUMENTS

| | | | |
|---|---|---|---|
| 7,981,789 B2 | 7/2011 | Schulz et al. | |
| 2005/0037605 A1 | 2/2005 | Kim et al. | |
| 2005/0142872 A1 | 6/2005 | Park | |
| 2007/0026665 A1 | 2/2007 | Bera et al. | |
| 2007/0120230 A1* | 5/2007 | Kim | H01L 21/02129 257/645 |
| 2007/0218671 A1 | 9/2007 | Oryoji et al. | |
| 2010/0163874 A1* | 7/2010 | Koyama | H01L 27/12 257/57 |
| 2011/0065220 A1* | 3/2011 | Lee | H01L 29/12 438/29 |
| 2011/0177639 A1* | 7/2011 | Kang | H01L 21/76816 438/34 |
| 2011/0183505 A1 | 7/2011 | Min et al. | |
| 2012/0161123 A1* | 6/2012 | Yamazaki | H01L 29/66742 257/43 |
| 2013/0119373 A1* | 5/2013 | Yamazaki | H01L 29/7869 257/43 |

FOREIGN PATENT DOCUMENTS

| | | |
|---|---|---|
| KR | 1020030054745 A | 7/2003 |
| KR | 1020040057580 A | 7/2004 |

\* cited by examiner

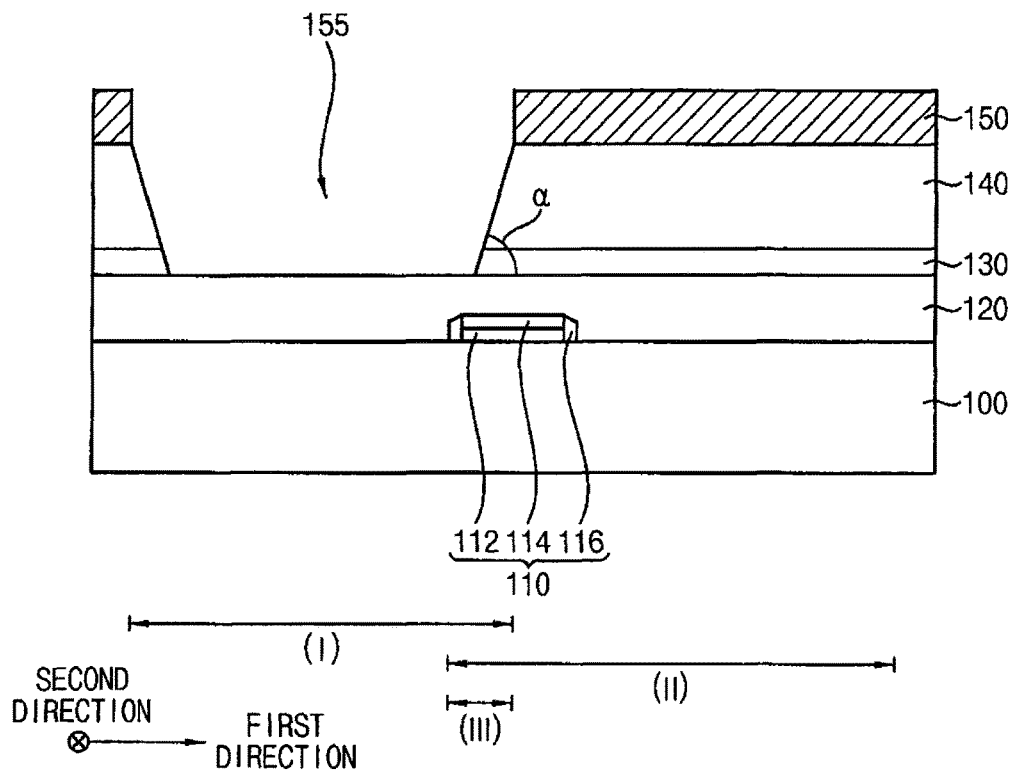
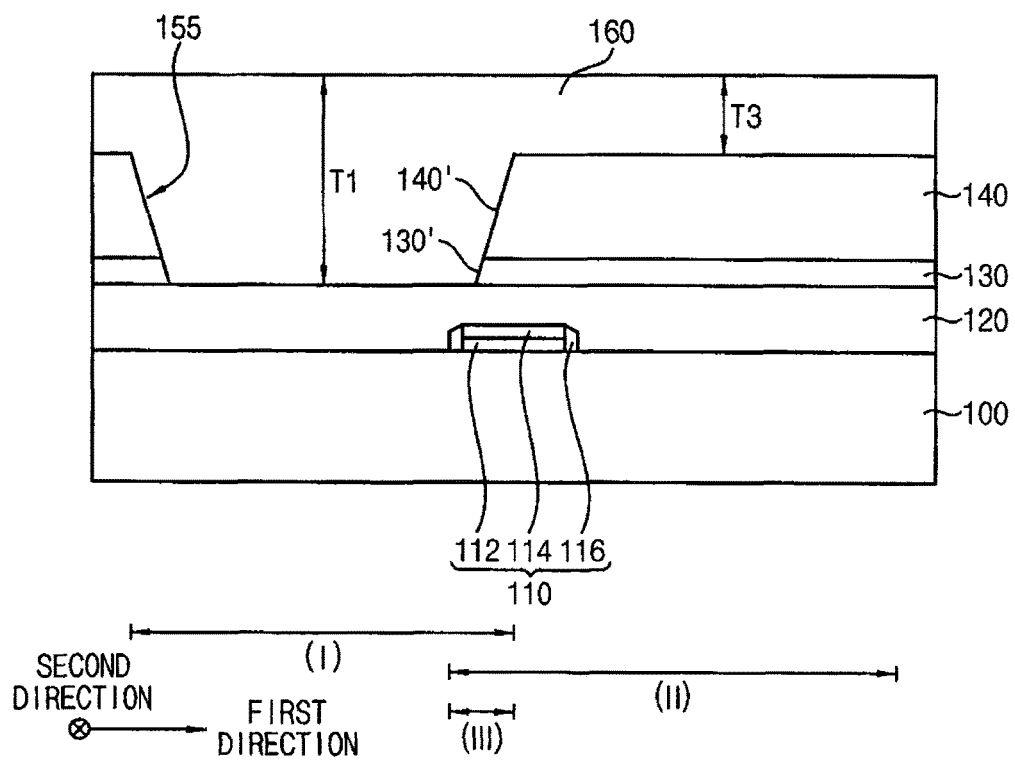

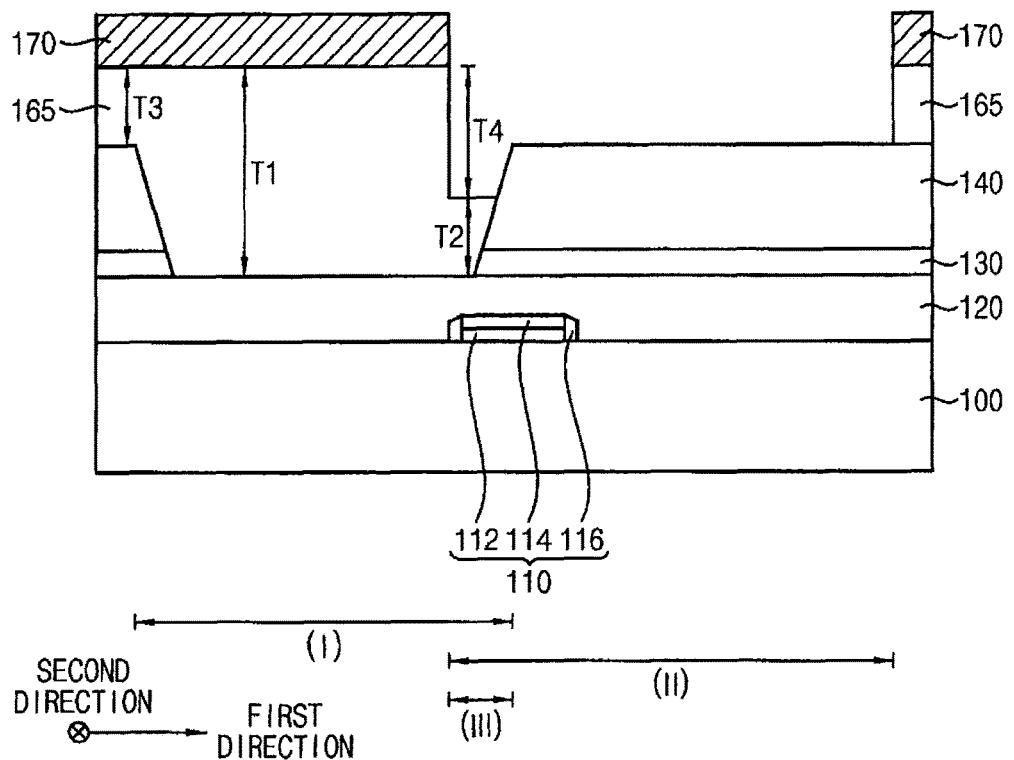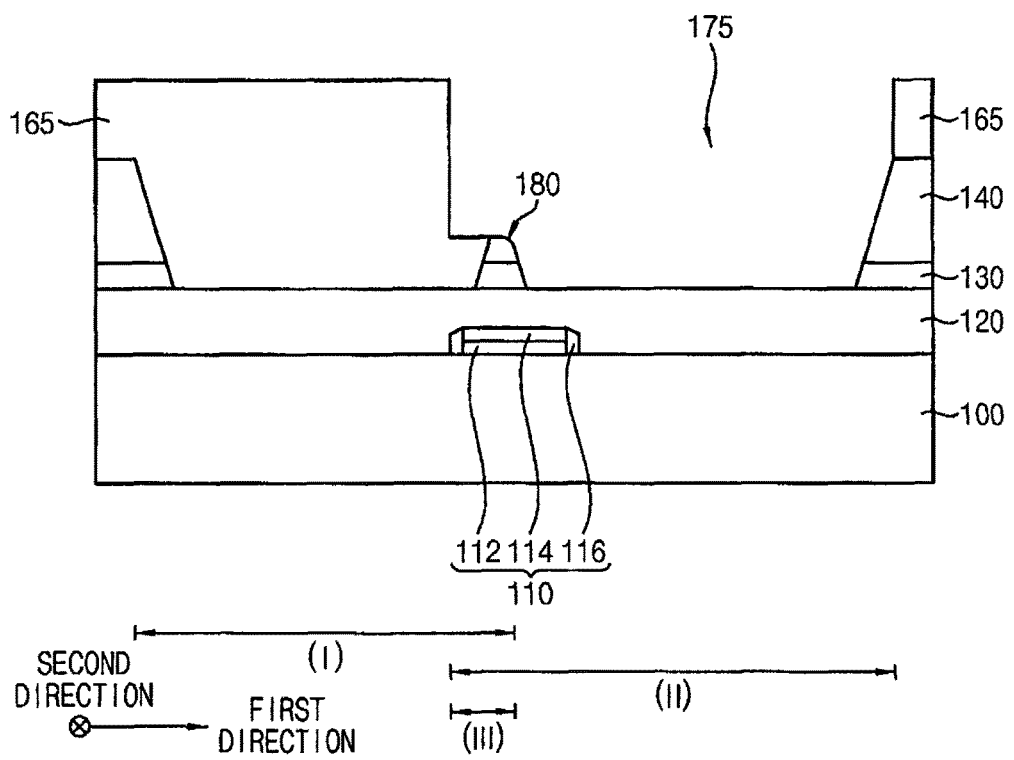

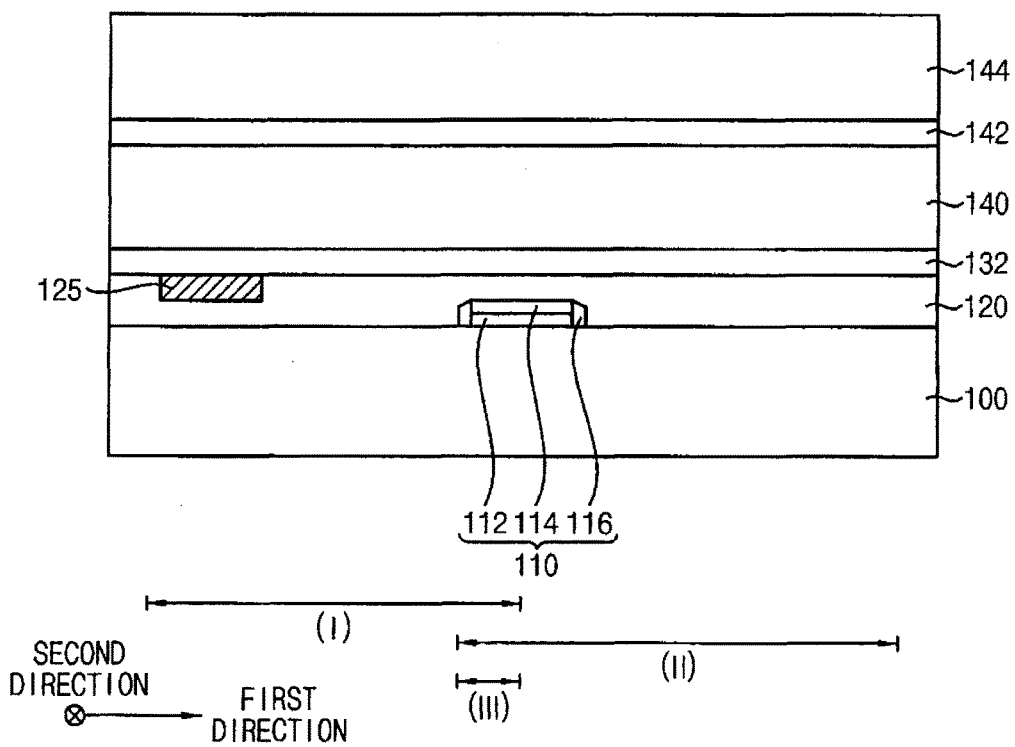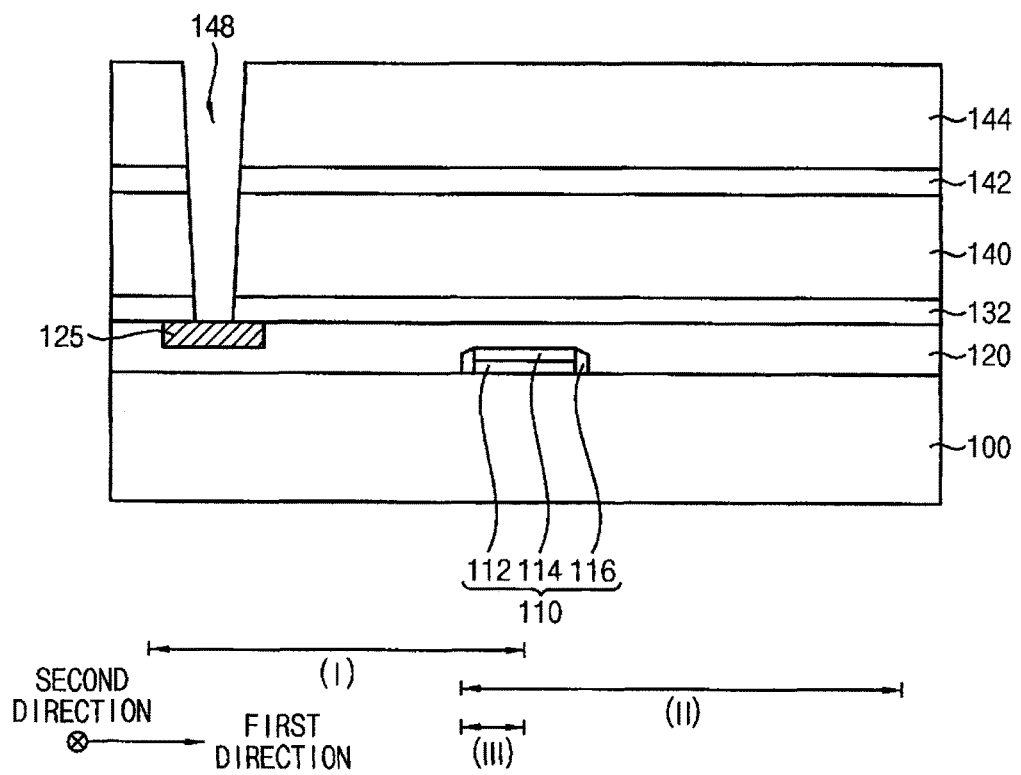

SEMICONDUCTOR STRUCTURES HAVING AN INSULATIVE ISLAND STRUCTURE

CLAIM OF PRIORITY

This application is a divisional of U.S. patent application Ser. No. 14/053,932, filed Oct. 15, 2013, which itself is a U.S. non-provisional patent application claiming priority under 35 USC §119 to Korean Patent Application No. 10-2012-0119210, filed on Oct. 25, 2012 in the Korean Intellectual Property Office (KIPO), the disclosure of which are herein incorporated by reference in their entirety.

BACKGROUND

1. Field

Some embodiments relate to semiconductor devices and methods of manufacturing semiconductor devices.

2. Description of the Related Art

As semiconductor devices have become more highly integrated, wiring structures included in the semiconductor device have also become more highly integrated. A wiring structure may be formed using a metal to reduce electrical resistance in the wiring structure. However, it may be difficult to pattern a metal layer with a high degree of precision. Accordingly, wiring structures may be formed by a damascene process in which trenches are formed and the—wiring structure is formed in the trenches. However, over-etching may be a problem during the process of forming the trenches.

SUMMARY

Some embodiments provide semiconductor devices including a wiring structures having improved reliability.

Some embodiments provide methods of forming semiconductor devices including wiring structures having improved reliability.

According to some embodiments, there is provided a method of forming a semiconductor device. In the method, an insulating layer is formed on a substrate. The insulating layer is at least partially removed to form a first trench in the insulating layer. A mask layer is formed in the first trench. The mask layer has a first thickness from a bottom surface of the first trench to the top surface of the mask layer. The mask layer is partially removed to form a mask that partially exposes a sidewall of the first trench. A portion of the mask adjacent to the exposed sidewall of the first trench has a second thickness that is smaller than the first thickness. The insulating layer is etched to form a second trench using the mask as an etching mask. The second trench is in fluid communication with the first trench. A conductive pattern is formed to fill the first trench and the second trench.

In some embodiments, the sidewall of the first trench exposed by the mask may make an oblique angle with respect to a top surface of the substrate.

In some embodiments, forming the second trench may include forming a remaining insulation pattern structure that includes portions of the insulating layer and/or an etch stop layer beneath the insulating layer remaining after the insulating layer is etched to form the second trench In some embodiments, the remaining insulation pattern structure and the portion of the mask adjacent to the exposed sidewall of the first trench may reduce or prevent over-etching of the insulating layer and/or the substrate during the process for forming the second trench.

In some embodiments, the portion of the mask adjacent to the exposed sidewall of the first trench may have a top surface that is lower than a top surface on the insulating layer.

In some embodiments, the portion of the mask adjacent to the exposed sidewall of the first trench may be disposed in a region where a first patterning region for forming the first trench and a second patterning region for forming the second trench may be overlapped.

In some embodiments, the first trench may extend in a first direction, and the second trench adjacent to the first trench may extend in a second direction substantially perpendicular to the first direction.

In some embodiments, the first trench may extend in a first direction, and the second trench adjacent to the first trench may extend in the first direction.

In some embodiments, before forming the insulating layer, an etch stop layer may be further formed on the substrate. Forming the insulating layer may include forming the insulating layer on the etch stop layer.

In some embodiments, forming the first trench and forming the second trench may include using the etch stop layer as an end point of an etching process According to some embodiments, there is provided a semiconductor device including a conductive structure on a substrate, a first insulating layer, an insulation pattern structure and a conductive pattern. The first insulating layer is disposed on the substrate to cover the conductive structure. The insulation pattern structure is disposed on the first insulating layer to be overlapped with the conductive structure. The insulation pattern structure includes a first insulation pattern and a second insulation pattern sequentially stacked. A width of the insulation pattern structure is gradually reduced, as a height of the insulation pattern structure becomes higher. A conductive pattern is disposed on the first insulating layer to cover the insulating pattern structure.

In some embodiments, the conductive pattern may include copper, aluminum, tungsten, ruthenium, titanium nitride or tantalum nitride.

In some embodiments, the semiconductor device may further include an etch stop layer on the first insulating layer, the etch stop layer partially surrounding a sidewall of the conductive pattern, and a second insulating layer on the etch stop layer, the second insulating layer partially surrounding the sidewall of the conductive pattern.

In some embodiments, the first insulation pattern may include a material substantially the same as that of the etch stop layer, and the second insulation pattern may include a material substantially the same as that of the second insulating layer.

In some embodiments, the first insulation pattern may include silicon nitride, and the second insulation pattern may include silicon oxide.

Methods of forming a semiconductor device according to further embodiments include providing an insulating layer, forming a first trench in a first patterning region in the insulating layer, forming a mask layer in the first trench, and patterning the mask layer to form a mask that defines a second patterning region in the insulating layer, wherein the first patterning region and the second patterning region overlap in a third patterning region, and wherein the mask has a first thickness in the third patterning region that is smaller than a second thickness of the mask in a portion of the first patterning region that does not overlap the second patterning region. The insulating layer is etched to form a second trench in the insulating layer using the mask as an etching mask, the second trench being in fluid communication with the first trench, and a conductive pattern is formed in the first trench and the second trench.

According to some embodiments, the wiring structure included in the semiconductor device may be formed by a damascene process. In the damascene process, a first trench and a second trench may be formed by a different patterning process using a first mask and a second mask, respectively. The second mask may have a predetermined thickness in a region where a first patterning region for forming the first trench and a second patterning region for forming the second trench are overlapped. Therefore, a portion of the second mask in the region may prevent over etching problem.

BRIEF DESCRIPTION OF THE DRAWINGS

Some embodiments will be more clearly understood from the following detailed description taken in conjunction with the accompanying drawings. FIGS. 1 to 22 represent non-limiting, some embodiments as described herein.

FIGS. 1 to 12 are cross-sectional views and plan views illustrating methods of forming a semiconductor device in accordance with some embodiments;

FIGS. 13 to 18 are cross-sectional views illustrating methods of forming a semiconductor device in accordance with some embodiments; and FIGS. 19 to 22 are cross-sectional views and plan views illustrating methods of forming a semiconductor device in accordance with some embodiments.

DETAILED DESCRIPTION OF THE EMBODIMENTS

Figure 1:
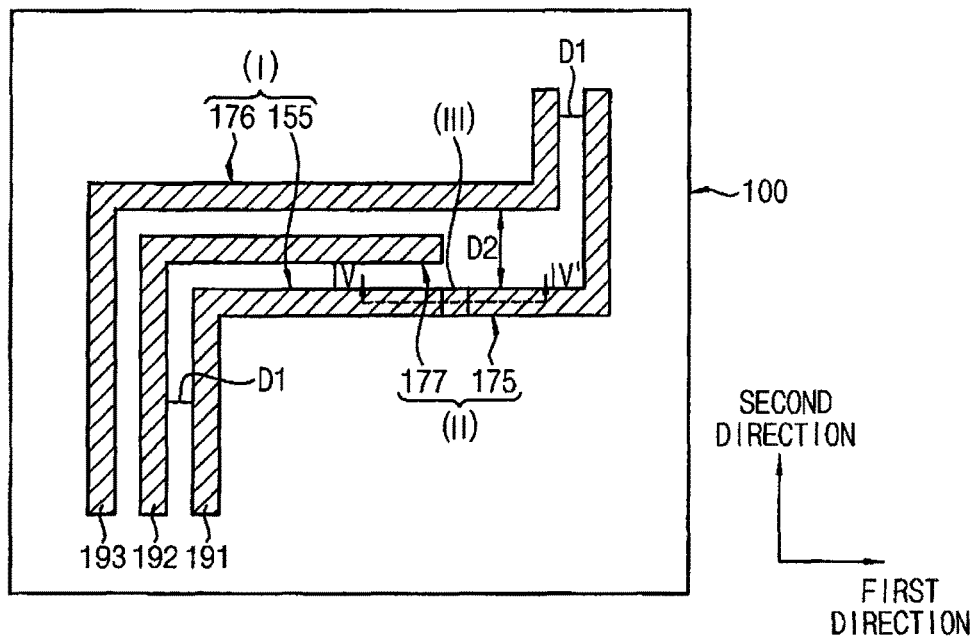

Various some embodiments will be described more fully hereinafter with reference to the accompanying drawings, in which some embodiments are shown. The present inventive concept may, however, be embodied in many different forms and should not be construed as limited to the some embodiments set forth herein. Rather, these some embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular some embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments are described herein with reference to cross-sectional illustrations that are schematic illustrations of idealized some embodiments (and intermediate structures). As such, variations from the shapes of the illustrations as a result, for example, of manufacturing techniques and/or tolerances, are to be expected. Thus, some embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, some embodiments will be explained in detail with reference to the accompanying drawings.

Figure 2:
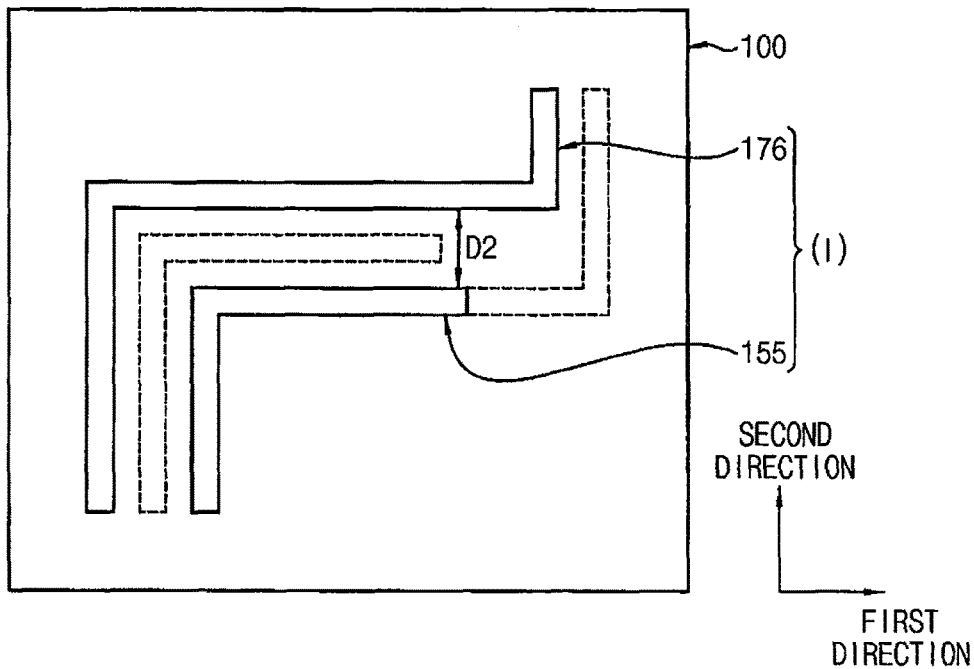
Figure 3:
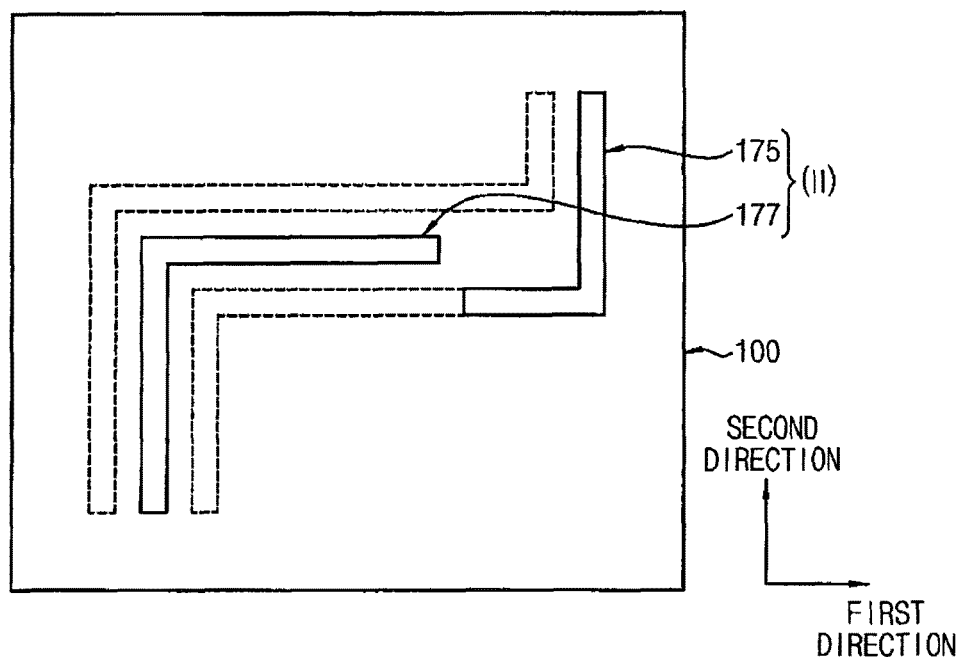

FIGS. 1 to 12 are cross-sectional views and plan views illustrating methods of forming a semiconductor device in accordance with some embodiments. In particular, FIGS. 1, 2 and 3 are plan views illustrating methods of forming a semiconductor device in accordance with some embodiments, and FIGS. 4 to 12 are cross-sectional views cut along the lines IV-IV of FIG. 1.

Referring to FIGS. 1 to 3, the semiconductor device may include a wiring structure having a plurality of conductive patterns. In some embodiments, the wiring structure may include a first conductive pattern 191, a second conductive pattern 192 and a third conductive pattern 193 on a substrate 100. The first conductive pattern 191, the second conductive pattern 192 and the third conductive pattern 193 may be arranged sequentially adjacent to each other, and each of the first conductive pattern 191, the second conductive pattern 192 and the third conductive pattern 193 may extend in a first direction and a second direction substantially perpendicular to the first direction. The second conductive pattern 192 may have a length that is shorter than the first conductive pattern 191 and the third conductive pattern 193, so that the first conductive pattern 191 and the third conductive pattern 193 may be adjacent to each other in a certain region of the substrate 100.

The shortest distance between the adjacent conductive pattern 191, 192 and 193, that is a distance between the first conductive pattern 191 and the second conductive pattern 192 in the first direction or the second direction, a distance between the second conductive pattern 192 and the third conductive pattern 193 in the first direction or the second direction, and a distance between the first conductive pattern 191 and the third conductive pattern 193 in the region (where the second conductive pattern 192 is not disposed) in the first direction, may be defined as a first distance D1. On the other hand, a distance between the first conductive pattern 191 and the third conductive pattern 193 in the region (where the second conductive pattern 192 is not disposed) in the second direction, may be defined as a second distance D2.

The conductive patterns 191, 192 and 193 may be formed by a damascene process. That is, a second insulting interlayer 140 (see FIG. 5) on the substrate 100 may be partially etched to form first, second, third and fourth trenches 155, 175, 176 and 177 (see FIGS. 1, 8 and 10), a conductive layer may be formed to fill the trenches 155, 175, 176 and 177, and then the conductive layer may be planarized to form the conductive patterns 191, 192 and 193.

Referring to FIGS. 1 to 3, the third conductive pattern 193 is formed in the fourth trench 177 and the second conductive pattern 192 is formed in the third trench 176. The first conductive pattern 191 is formed in the first and second trenches 155, 175 for reasons that will be made apparent in the following discussion.

Due to the limited resolution of the optical patterning (photolithographic) process by which the trenches are etched, the trenches 155, 175, 176 and 177 for receiving the conductive patterns 191, 192 and 193 may be formed by a multi-patterning process instead of a single patterning process. For example, trenches spaced the second distance D2 apart from each other may be formed simultaneously in a single patterning process. However, trenches spaced the first distance D1 apart from each other may not be formed simultaneously by a single patterning process due to the limited resolution of the photolithographic process.

In some embodiments, the first conductive pattern 191 may be spaced the first distance D1 apart from the second conductive pattern 192 in some portions of the substrate 100, and may be spaced the first distance D1 apart from the third conductive pattern 193 in some other portions of the substrate 100, so that trenches for receiving the first conductive pattern 191, the second conductive pattern 192 and the third conductive pattern 193 may not be formed simultaneously.

However, the first trench 155 for the first conductive pattern 191 may be spaced the second distance D2 apart from the third trench 176 for the third conductive pattern 193, so that the first trench 155 and the third trench 176 may be formed simultaneously. Further, the fourth trench 177 for the second conductive pattern 192 (see FIG. 3) and the second trench 175 for the first conductive pattern 191 may be formed simultaneously. Accordingly, the first trench 155 and the third trench 176 may be formed simultaneously in a first patterning process (see FIG. 2), while the second trench 175 and the fourth trench 177 may be formed simultaneously in a second patterning process (see FIG. 3).

A patterning region for forming the first trench 155 may overlap a patterning region for forming the second trench 175 to provide an alignment margin. That is, because there is a margin of error associated with the alignment of different photolithographic masks, the photolithographic pattern that defines the first trench 155 may be designed to slightly overlap the photolithographic pattern that defines the second trench 175 to ensure that the trenches 155 and 175 are connected (i.e., in fluid communication) to one another when they are formed.

In this case, a patterning region for forming the first trench 155 and the third trench 176 may be defined as a first patterning region I (see FIG. 2), and a patterning region for forming the second trench 175 and the fourth trench 177 may be defined as a second patterning region II (see FIG. 3). Further, a patterning region where the first patterning region I and the second patterning region II overlap may be defined as a third patterning region III (see FIG. 4).

A problem may arise when trenches are formed to overlap one another. In particular, over-etching may occur in a region where a first trench and a second trench overlap. Embodiments of the present invention address this problem by using a first mask to form the first trench and a second mask to form the second trench, wherein the second mask has a reduced thickness in a region where the trenches overlap.

Methods of manufacturing a semiconductor device including the wiring structure shown in FIGS. 1 to 3 are explained with reference to FIGS. 4 to 12.

Figure 4:
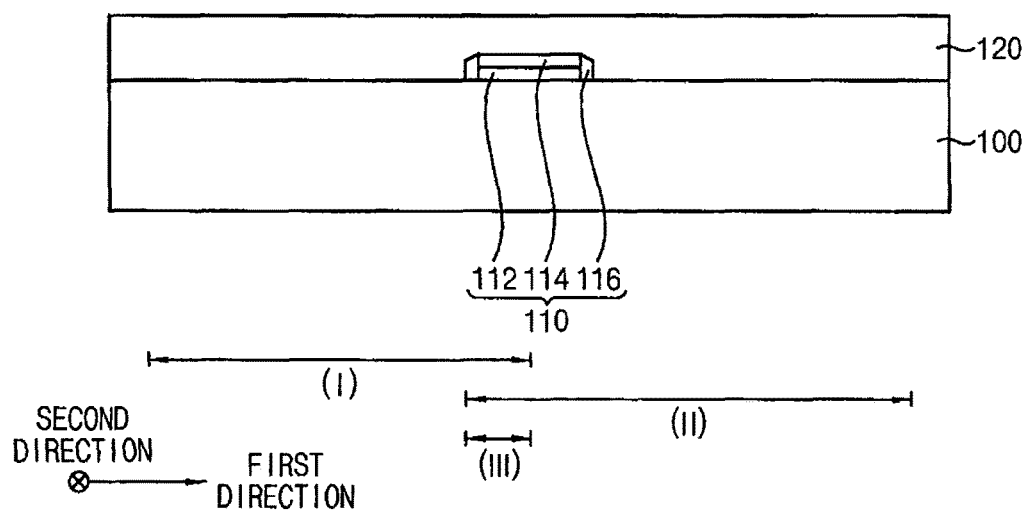

Referring to FIG. 4, a conductive structure may be formed on the substrate 100, and a first insulating interlayer 120 may be formed on the substrate 100 to cover the conductive structure.

The substrate 100 may include a semiconductor substrate such as a silicon substrate, germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

For example, the conductive structure may include a semiconductor device such as a transistor, a diode or a thyristor and/or an element of the semiconductor device such as a contact, a conductive layer, a dielectric layer, a wire or a gate structure. In some embodiments, the conductive structure may include a gate structure 110.

For example, the gate structure 110 may be formed by sequentially stacking a gate insulation layer and a gate electrode layer on the substrate 100, by patterning the gate insulation layer and the gate electrode layer to form a gate insulation layer pattern 112 and a gate electrode 114, and by forming a spacer 116 on sidewalls of the gate insulation layer pattern 112 and the gate electrode 114.

Then, a first insulating interlayer 120 may be formed on the substrate 100 to cover the gate structure 110. In some embodiments, the first insulating interlayer 120 may be formed using silicon oxide such as Boro-Phospho-Silicate Glass (BPSG), Tonen Silazene (TOSZ), Undoped Silicate Glass (USG), Spin On Glass (SOG), Flowable Oxide (FOX) and/or Tetra-Ethyl-Ortho-Silicate (TEOS).

Figure 5:
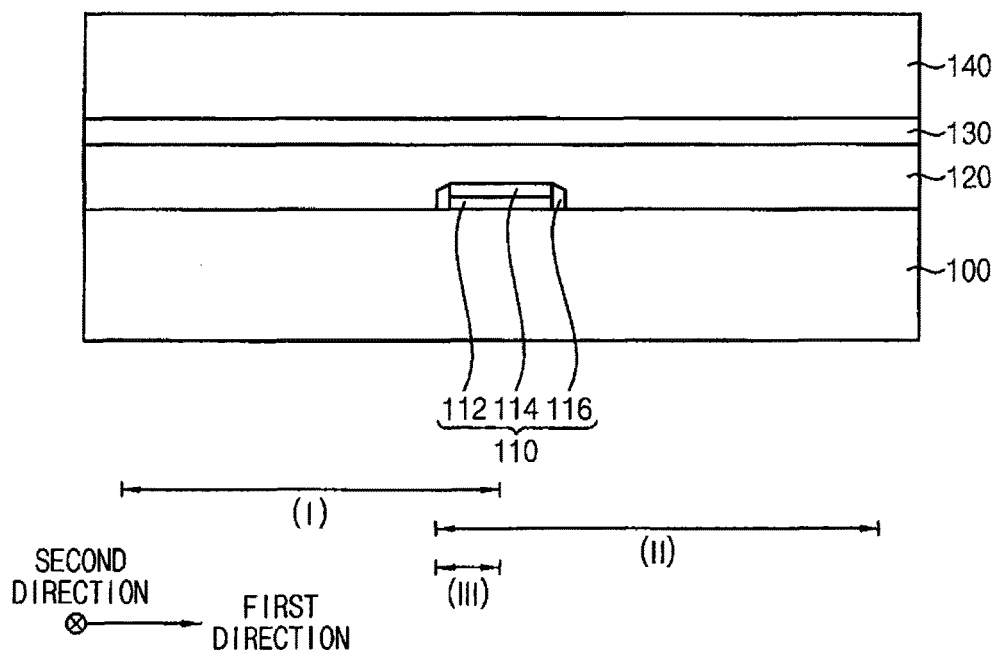

Referring to FIG. 5, an etch stop layer 130 and a second insulating interlayer 140 may be sequentially formed on the first insulating interlayer 120.

The etch stop layer 130 may be formed using a material having an etch selectivity with respect to the first insulating interlayer 120 and/or the second insulating interlayer 140. In some embodiments, when the first insulating interlayer 120 and the second insulating interlayer 140 include silicon oxide, the etch stop layer 130 may include silicon nitride.

In some embodiments, the second insulating interlayer 140 may be formed using a material substantially the same as or similar to that of the first insulating interlayer 120.

Figure 6:
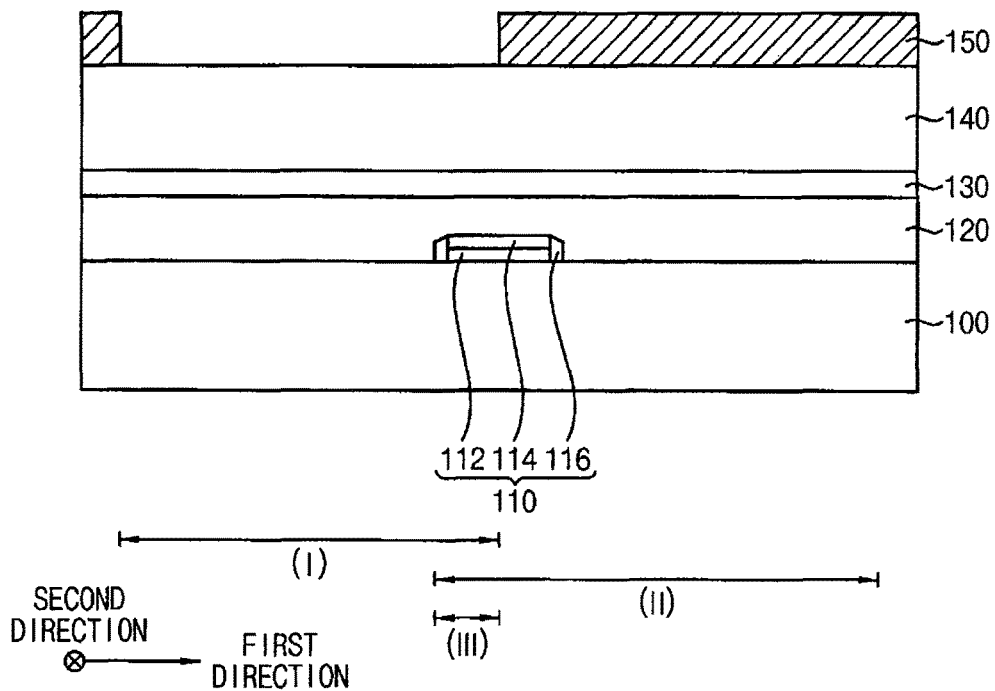

Referring to FIG. 6, a first mask 150 may be formed on the second insulating interlayer 140.

In some embodiments, a first mask layer may be formed on the second insulating interlayer 140 using a material having an etch selectivity with respect to the second insulating interlayer 140, and the first mask layer may be patterned by a photolithographic process to form the first mask 150. In particular, a photoresist pattern (not illustrated) may be formed on the first mask layer, and the first mask layer may be etched using the photoresist pattern as an etch mask to form the first mask 150. Then, the remaining photoresist pattern may be removed by an ashing process.

In some embodiments, the first mask layer may be formed using a nitride such as silicon nitride or titanium nitride, silicon based spin-on hardmask (Si—SOH), carbon based spin-on hardmask (C—SOH) and/or amorphous carbon layer (ACL). In some embodiments, the first mask layer may be formed using C—SOH.

The first mask 150 may expose the second insulating interlayer 140 in the first patterning region I for forming the first trench 155 (See FIG. 7). That is, the first mask 150 may not be disposed in the first patterning region I.

Referring to FIG. 7, the second insulating interlayer 140 and the etch stop layer 130 may be partially removed by using the first mask 150 as an etch mask to form the first trench 155.

A first etching process may be performed using an etching gas having a relatively high etch rate with respect to the second insulating interlayer 140. Therefore, a portion of the second insulating interlayer 140, which is not covered by the first mask 150, may be removed. The etch stop layer 130 may be used as an end point of the etching process.

Then, a second etching process may be performed using an etching gas having a relatively high etch rate with respect to the etch stop layer 130. Therefore, a portion of the etch stop layer 130, which is not covered by the first mask 150 and the second insulating interlayer 140, may be removed to form the first trench 155.

In this case, an angle α between atop surface of the substrate 100 and sidewalls of the first insulating interlayer 140 and the etch stop layer 130 exposed by the first trench 155 may be an oblique angle (i.e., neither perpendicular nor parallel). In some embodiments, the angle α between the top surface of the substrate 100 and sidewalls of the first insulating interlayer 140 and the etch stop layer 130 may be less than 90 degrees. The angle may change depending on a composition of the etch gas, the material of the second insulating interlayer 140, the material of the etch stop layer 130 and/or the process conditions of the etching process. For example, when the etching gas includes a relatively large content of carbon, the angle α may be smaller than 80 degrees. Alternatively, when the etching gas does not include carbon, the angle α may be in a range of 80 degrees to 90 degrees.

Referring to FIG. 8, after removing the first mask 150, a second mask layer 160 may be formed on the first insulating interlayer 120 and the second insulating interlayer 140 to fill the first trench 155.

The second mask layer 160 may be formed on top surfaces of the first insulating interlayer 120 and the second insulating interlayer 140 and sidewalls of the second insulating interlayer 140 and the etch stop layer 130 using a nitride such as silicon nitride or titanium nitride, Si—SOH, C—SOH and/or ACL. When the second mask layer 160 includes C—SOH, the second mask layer 160 may have a relatively large etch selectivity with respect to the second insulating interlayer 140 and the etch stop layer 130, and may sufficiently fill the first trench 155 even when the first trench 155 has a relatively large aspect ratio.

The second mask layer 160 may have a top surface which may be substantially flat. Therefore, a first portion of the second mask layer 160 disposed on the first insulating interlayer 120 may have a first thickness T1 from a bottom surface of the first trench 155. A second portion of the second mask layer 160 disposed on the second insulating interlayer 140 may have a third thickness T3 from a top surface of the second insulating interlayer 140. The third thickness T3 may be substantially smaller than the first thickness T1. Further, the second mask layer may be formed on the inclined sidewalls 130', 140' of the etch stop layer 130 and the second insulating interlayer 140, and a third portion of the second mask layer 160 disposed on the inclined sidewalls 130', 140' may have a thickness that is smaller than the first thickness T1 and larger than the third thickness T3.

Referring to FIG. 9, a photoresist pattern 170 may be formed on the second mask layer 160, and portions of the second mask layer 160 may be removed to form a second mask 165.

In particular, the photoresist pattern 170 may be formed by forming a photoresist layer using ACL and by patterning the photoresist layer by a photolithographic process. In some embodiments, the photoresist pattern 170 may be formed to expose the second mask layer 160 in the second patterning region II for forming the second trench 175 (See FIG. 10). In this case, as mentioned above the patterning region, where the first patterning region I and the second patterning region II are overlapped, may be defined as the third patterning region III.

Then, the second mask layer 160 may be partially removed using the photoresist pattern 170 as an etch mask to form the second mask 165.

Referring still to FIG. 9, in some embodiments, the etching process may be adjusted to remove a predetermined fourth thickness T4 from the second mask layer 160. The fourth thickness T4 may be substantially larger than the third thickness T3, and may be substantially smaller than the first thickness T1. Therefore, a portion of the second mask layer 160 on the second insulating interlayer 140 may be removed completely, while a portion of the second mask layer 160 in the third patterning region III may be only partially removed. Thus, the second mask 165 may have the first thickness T1 in the first patterning region I, and may have a second thickness T2 in the third patterning region III (where T2=T1−T4). The second thickness T2 may therefore be substantially smaller than the first thickness T1.

Accordingly, the second mask 165 may partially expose a sidewall of the first trench 155 (that is, a sidewall of the second insulating interlayer 140). The exposed sidewall of the first trench 155 may be disposed in the third patterning region Ill.

Then, the remaining photoresist pattern 170 may be removed by an ashing process.

Referring to FIG. 10, the second insulating interlayer 140 and the etch stop layer 130 may be partially removed to form the second trench 175.

The second trench 175 may be formed by an etching process using the second mask 165 as an etch mask. Therefore, portions of the second insulating interlayer 140 and the etch stop layer 130 exposed by the second mask 165 may be removed.

In the etching process, portions of the second insulating interlayer 140 and the etch stop layer 130 disposed in the third patterning region III may be covered by the second mask 165, the portions of the second insulating interlayer 140 and the etch stop layer 130 disposed in the third patterning region Ill may not be removed to form a remaining insulation pattern structure 180. In some embodiments, the insulation pattern structure 180 may have a single layer structure including a nitride of the etch stop layer 130, or may have a double layer structure including a nitride of the etch stop layer 130 and an oxide of the second insulating interlayer 140.

If the second mask 165 is not disposed in the third patterning region III, the first insulating interlayer 120 may be over-etched during the etching process for forming the second trench 175, thereby potentially damaging the conductive structure, such as the gate structure 110, beneath the first insulating interlayer 120. On the other hand, if the second mask 165 were to be formed to have the first thickness T1 in the third patterning region III, the portions of the etch stop layer 130 and the second insulating interlayer 140 disposed in the third patterning region Ill might not be sufficiently removed, so that the second trench 175 may not be fluid-communicated with the first trench 155.

According to some embodiments, the second mask 165 may have the second thickness T2 in the third patterning region Ill, which may be substantially smaller than the first thickness T1, so that the portions of the etch stop layer 130 and/or the second insulating interlayer 140 disposed in the third patterning region III may not be completely removed, and the first insulating interlayer 120 may not be over-etched.

Figure 11:
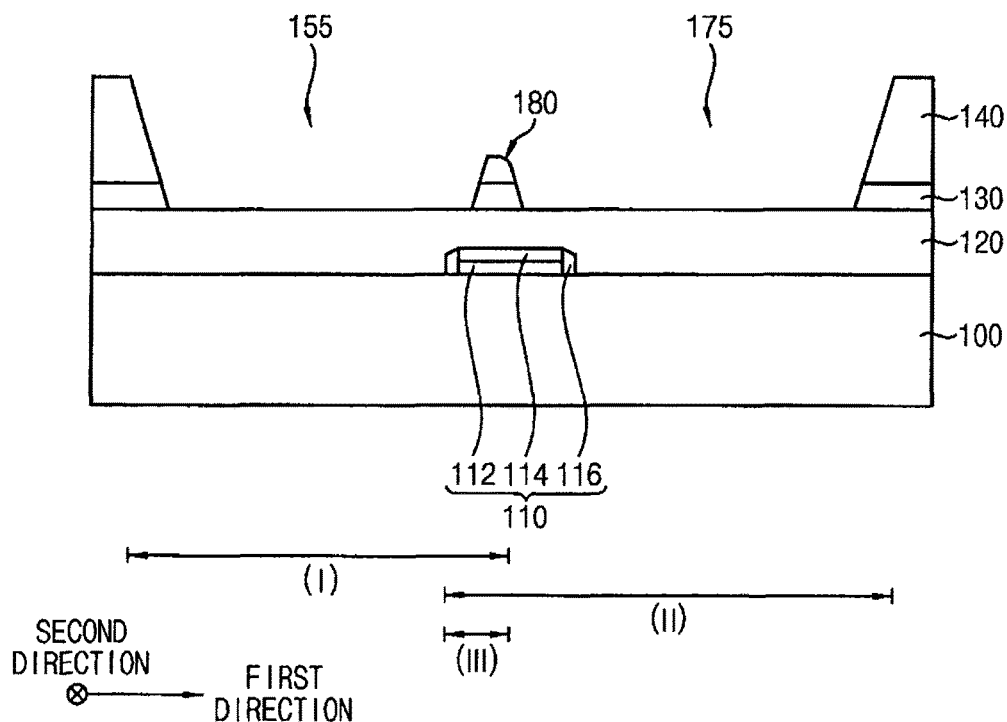

Referring to FIG. 11, the first trench 155 may be fluid-communicated with the second trench 175 by removing the second mask 165. In some embodiments, when the second mask 165 includes C—SOH, the second mask 165 may be fully removed by an ashing process.

Figure 12:
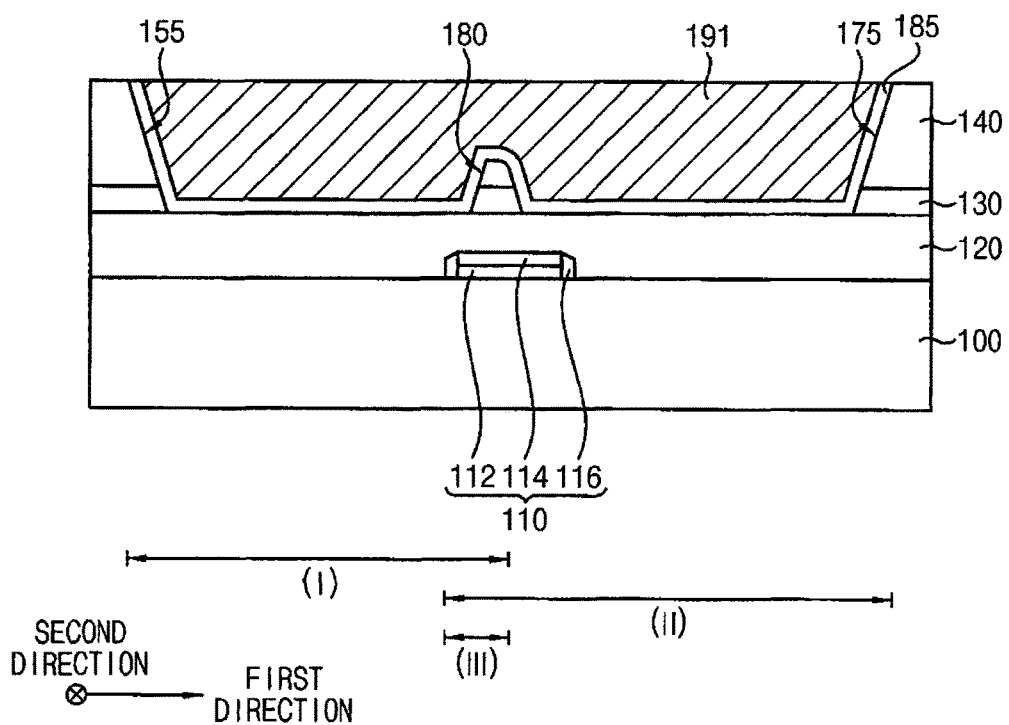

Referring to FIG. 12, a diffusion stop layer pattern 185 and a first conductive pattern 191 may be formed to fill the first trench 155 and the second trench 175.

In particular, a diffusion stop layer may be formed on upper surfaces of the second insulating interlayer 140, the first insulating interlayer 120 and the insulation pattern structure 180 and sidewalls of the second insulating interlayer 140, the etch stop layer 130 and the insulation pattern structure 180. Then, a conductive layer may be formed on the diffusion stop layer. Upper portions of the diffusion stop layer and the conductive layer may be planarized to form the diffusion stop layer pattern 185 and the first conductive pattern 191. In some embodiments, the planarization process may be performed by an etch back process or a CMP process until the top surface of the second insulating interlayer 140 is exposed.

The diffusion stop layer may be formed using a nitride, such as tantalum nitride (TaNx) and/or titanium nitride (TiNx), and the conductive layer may be formed using a metal, such as copper (Cu), aluminum (Al), tungsten (W) or ruthenium (Ru), or a metal nitride such as TaNx or TiNx, etc. In some embodiments, the conductive layer may be formed by forming a copper seed layer on the diffusion stop layer, and by forming a copper layer by a CVD process or an electroplating process. When the first conductive pattern 191 includes copper, the first conductive pattern 191 may have a relatively low electric resistance.

According to some embodiments, in methods of manufacturing a semiconductor device, the conductive pattern 191 may be formed by a damascene process. In the damascene process, the first trench 155 and the second trench 175 may be formed by different patterning processes using the first mask 150 and the second mask 165, respectively. In this case, the second mask 165 may have a second thickness T2 in the third patterning region III, where the first patterning region I and the second patterning region III overlap, so that the second mask 165 may at least partially cover the second insulating interlayer 140 in the third patterning region II. Therefore, the first insulating interlayer 120 may not be over-etched in the third patterning region III.

A semiconductor device including the wiring structure will be described hereinafter.

Referring to FIGS. 1 to 12, the semiconductor device including the wiring structure may include the substrate 100, the conductive structure, the first insulating interlayer 120, the etch stop layer 130, the second insulating interlayer 140, the insulation pattern structure 180, the diffusion stop layer pattern 185 and the first conductive pattern 191.

The conductive structure may include a semiconductor device such as a transistor, a diode or a thyristor and/or an element of the semiconductor device such as a contact, a conductive layer, a dielectric layer, a wire or a gate structure. In an example embodiment, the conductive structure may include the gate structure 110.

The first insulating interlayer 120 may be disposed on the substrate 100 to cover the conductive structure. In some embodiments, the first insulating interlayer 120 may include silicon oxide.

The etch stop layer 130 and the second insulating interlayer 140 may be sequentially stacked on the first insulating interlayer 120. Further, the first trench 155 and the second trench 175 may be disposed through the etch stop layer 130 and the second insulating interlayer 140.

The insulation pattern structure 180 may be disposed in the third patterning region III, where the first patterning region I for forming the first trench 155 and the second patterning region II for forming the second trench 175 may be overlapped. Therefore, the insulation pattern structure 180 may be disposed to overlap the conductive structure. Upper portion of the insulation pattern structure 180 may have a width larger than that of lower portion of the insulation pattern structure 180. For example, the width of the insulation pattern structure 180 may be gradually reduced, as height of the insulation pattern structure 180 becomes higher. In some embodiments, the insulation pattern structure 180 may have a single layer structure including a nitride of the etch stop layer 130, or may have a double layer structure including a nitride of the etch stop layer 130 and an oxide of the second insulating interlayer 140. The insulation pattern structure 180 may reduce over-etching of the first insulating interlayer 120 and the second insulating interlayer 140 during processes for forming the first trench 155 and the second trench 175.

The diffusion stop layer pattern 185 and the first conductive pattern 191 may be sequentially disposed on the first insulating interlayer 120 to cover the insulation pattern structure 180. Further, the diffusion stop layer pattern 185 and the first conductive pattern 191 may sufficiently fill the first trench 155 and the second trench 175.

In some embodiments, the diffusion stop layer pattern 185 may include titanium nitride or tantalum nitride. The diffusion stop layer pattern 185 may prevent the material of the first conductive pattern 191 (e.g., copper atom) from diffusing into the second insulating interlayer 140 and the etch stop layer 130.

In some embodiments, the first conductive pattern 191 may include Cu, Al, W, Ru, TiNx or TaNx. When the first conductive pattern 191 includes copper, the wiring structure may have a relatively low electric resistance.

FIGS. 13 to 18 are cross-sectional views illustrating methods of forming a semiconductor device in accordance with some embodiments. Some aspects of the methods illustrated in FIGS. 13 to 18 may be substantially the same as or similar to those illustrated with reference to FIGS. 1 to 12. Thus, like reference numerals refer to like elements, and repetitive explanations thereon may be omitted herein.

Referring to FIG. 13, processes substantially the same as or similar to those illustrated with reference to FIGS. 4 and 5 may be performed. That is, a gate structure 110 may be formed on a substrate 100, a first insulating interlayer 120 may be formed to cover the gate structure 100, a first etch stop layer 132, a second insulating interlayer 140, the second etch stop layer 142 and the third insulating interlayer 144 may be sequentially formed on the first insulating interlayer 120. In some embodiments, the first insulating interlayer 120 may be formed to include a lower conductive pattern 125.

In some embodiments, the second etch stop layer 142 and the third insulating interlayer 144 may be formed using materials substantially the same as or substantially similar to those of the first etch stop layer 132 and the first insulating interlayer 120, respectively.

Referring to FIG. 14, the first etch stop layer 132, the second insulating interlayer 140, the second etch stop layer 142 and the third insulating interlayer 144 may be partially removed to form a contact hole 148 exposing the lower conductive pattern 125.

Figure 15:
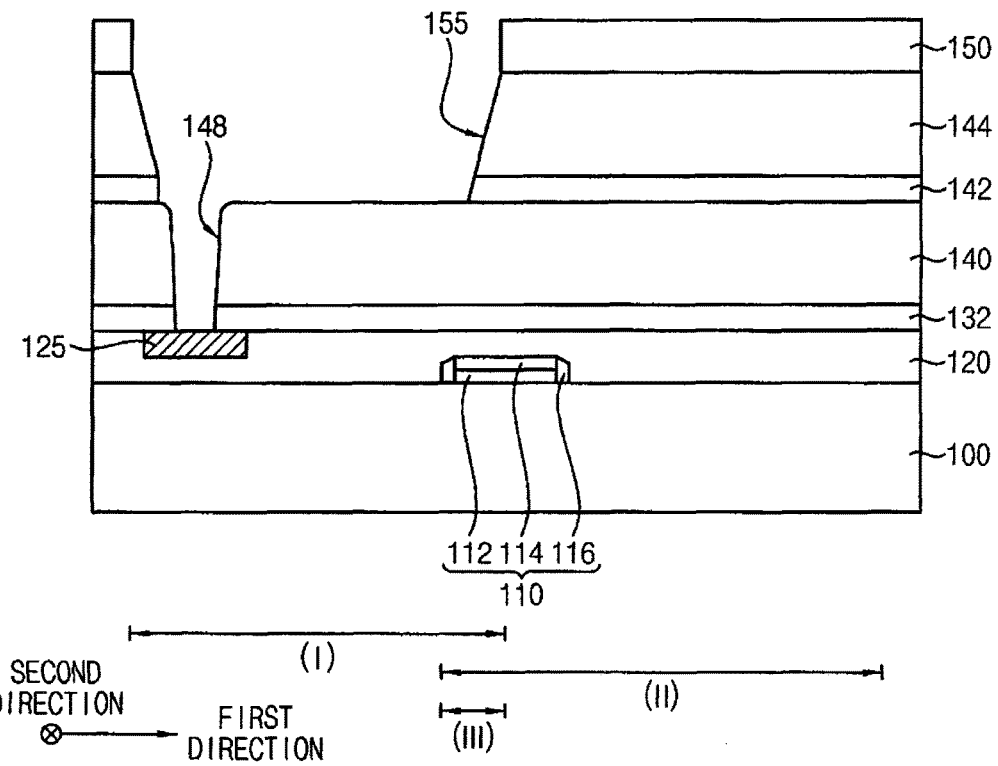

Referring to FIG. 15, after forming a sacrificial layer (not illustrated) on the lower conductive pattern 125 and the third insulating interlayer 144 to fill the contact hole 148, an upper portion of the sacrificial layer may be planarized to form a sacrificial layer pattern 157 (FIG. 16) in the contact hole 148. In some embodiments, the sacrificial layer may be formed using a material having an etch selectivity with respect to the first to the third insulating interlayer 120, 140 and 144 and the first and the second etch stop layers 132 and 134. For example, the sacrificial layer 157 (FIG. 16) may be formed using hydro-silses-quioxane (HSQ) layer by a spin coating process. Therefore, the sacrificial layer 157 (FIG. 16) may fill the contact hole 148 and may have a flat top surface.

Then, processes substantially the same as similar to those illustrated in FIG. 7 may be performed. That is, after forming a first mask 150 on the third insulating interlayer 144, the third insulating interlayer 144 and the second etch stop layer 142 may be partially removed to form a first trench 155. Then, the first mask 150 may be removed.

Figure 16:
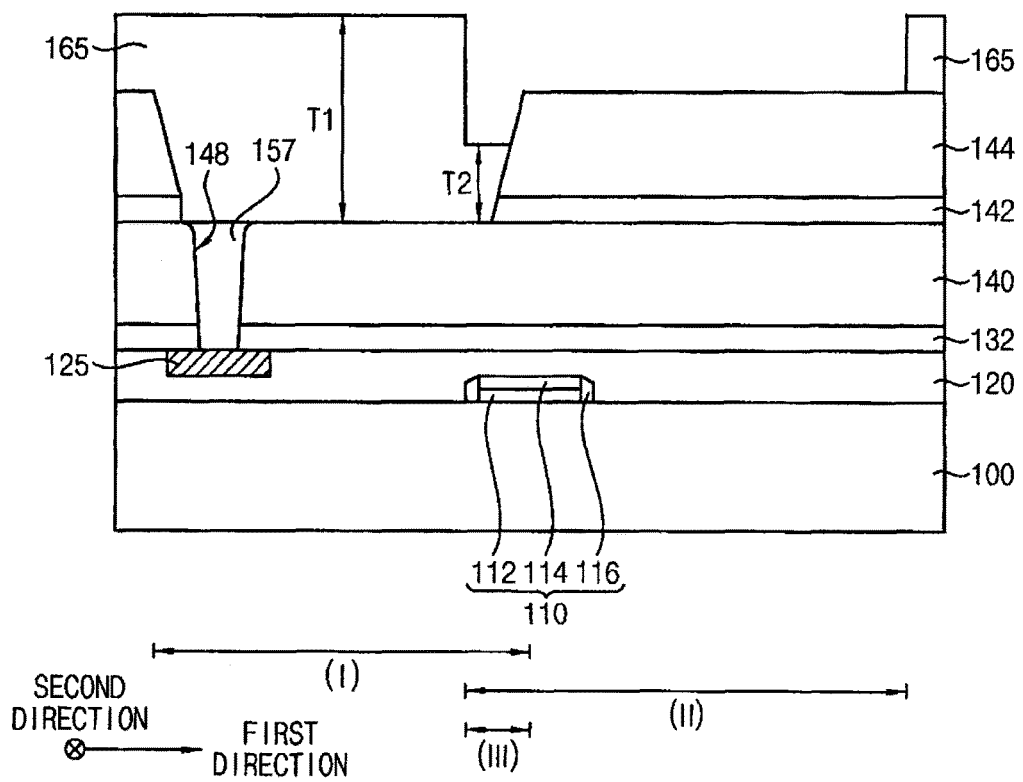

Referring to FIG. 16, processes substantially the same as or similar to those illustrated with reference to FIGS. 8 and 9 may be performed. That is, a second mask layer may be formed on the third insulating interlayer 144 to fill the first trench 155, and then the second mask layer may be partially removed to form a second mask 165.

Figure 17:
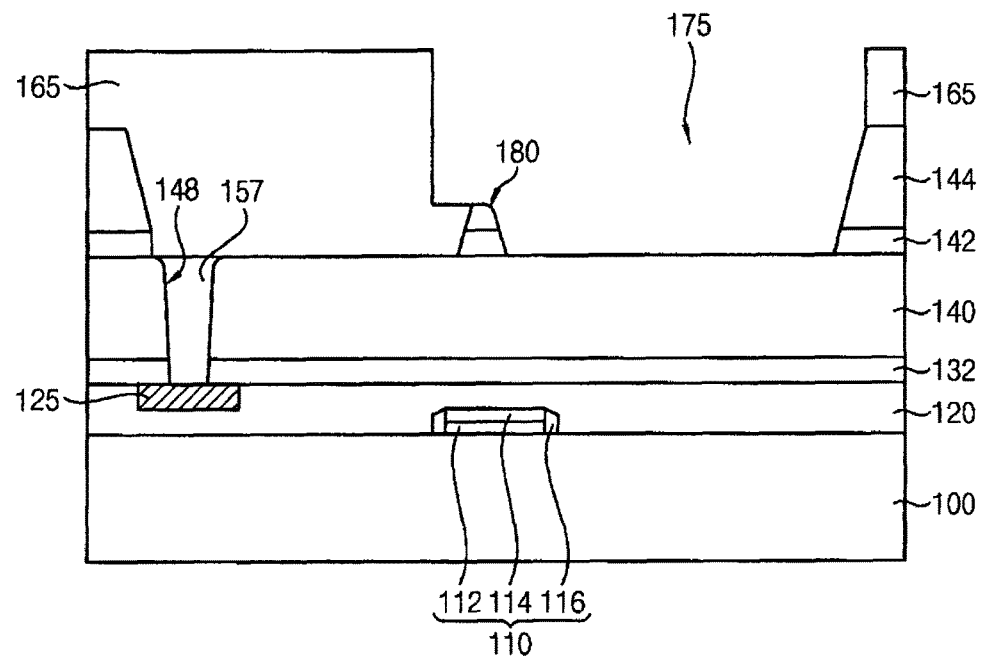

Referring to FIG. 17, the third insulating interlayer 144 and the second etch stop layer 142 may be partially etched using the second mask 165 to form a second trench 175. In the etching process, portions of the third insulating interlayer 144 and/or the second etch stop layer 142 in a third patterning region III may be covered by the second mask 165, so that portions of the third insulating interlayer 144 and/or the second etch stop layer 142 may not be etched to form a remaining insulation pattern structure 180.

Figure 18:
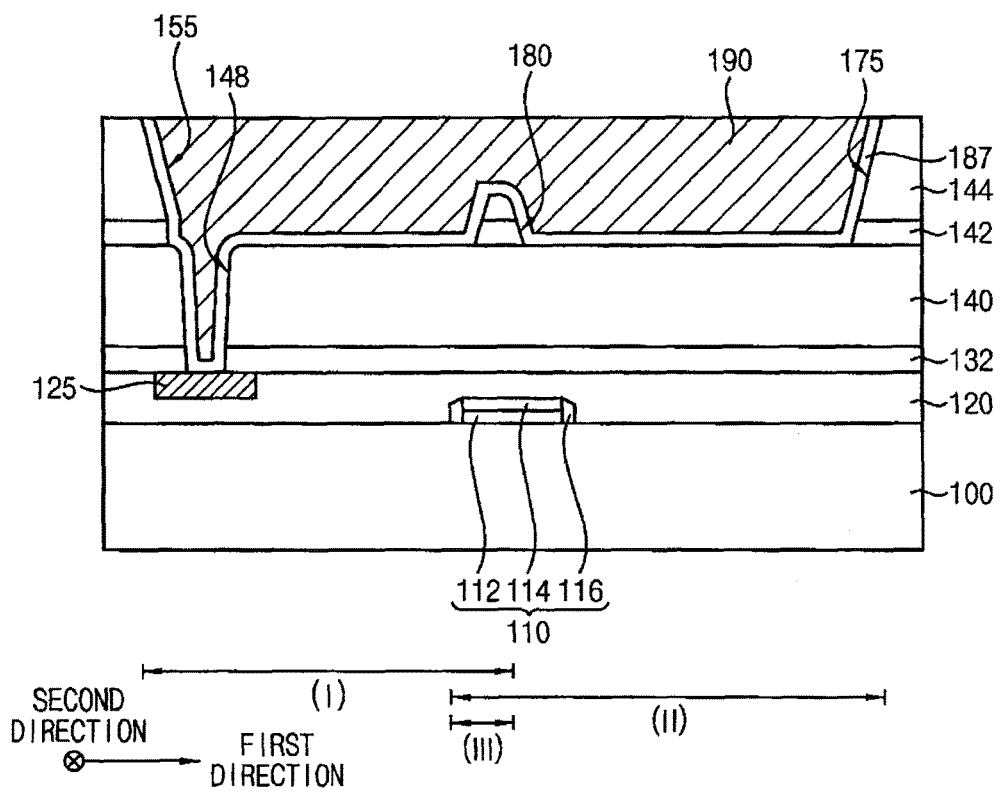

Referring to FIG. 18, processes substantially the same as or similar to those illustrated with reference to FIGS. 11 and 12 may be performed. That is, the second mask 165 and the sacrificial layer pattern 157 may be removed. Then, a diffusion stop layer pattern 187 and a conductive pattern 190 may be formed to fill the first trench 155 and the second trench 175.

In some embodiments, a diffusion stop layer may be form on the second insulating interlayer 140, the third insulating interlayer 144, the lower conductive pattern 125 and the insulation pattern structure 180, a conductive layer may be formed on the diffusion stop layer to fill the first trench 155, the second trench 175 and the contact hole 148. Then, upper portions of the diffusion stop layer and the conductive layer may be planarized to form the diffusion stop layer pattern 187 and the conductive pattern 190.

Figure 19:
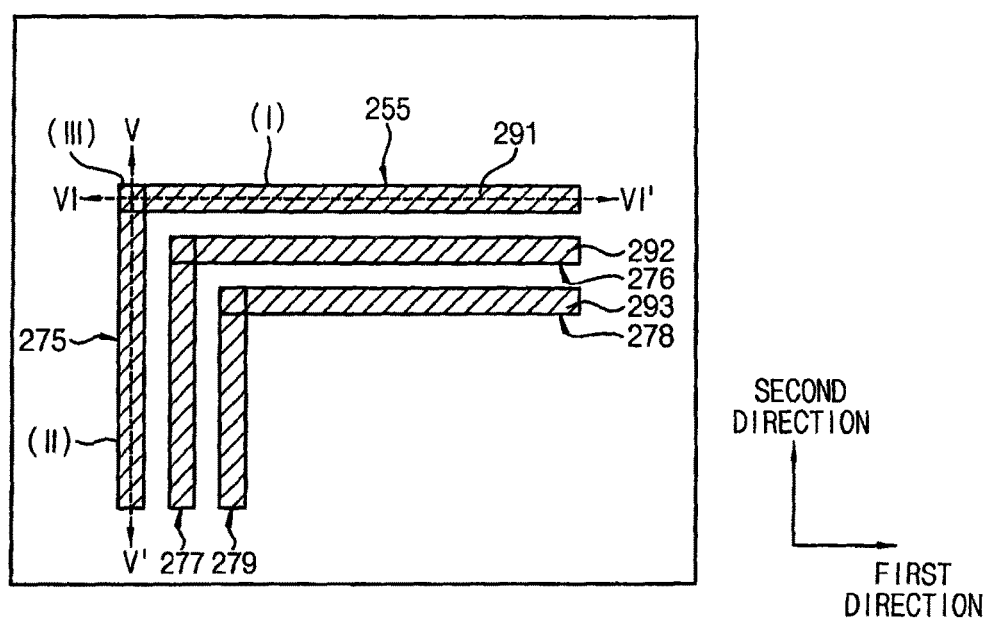
Figure 20:
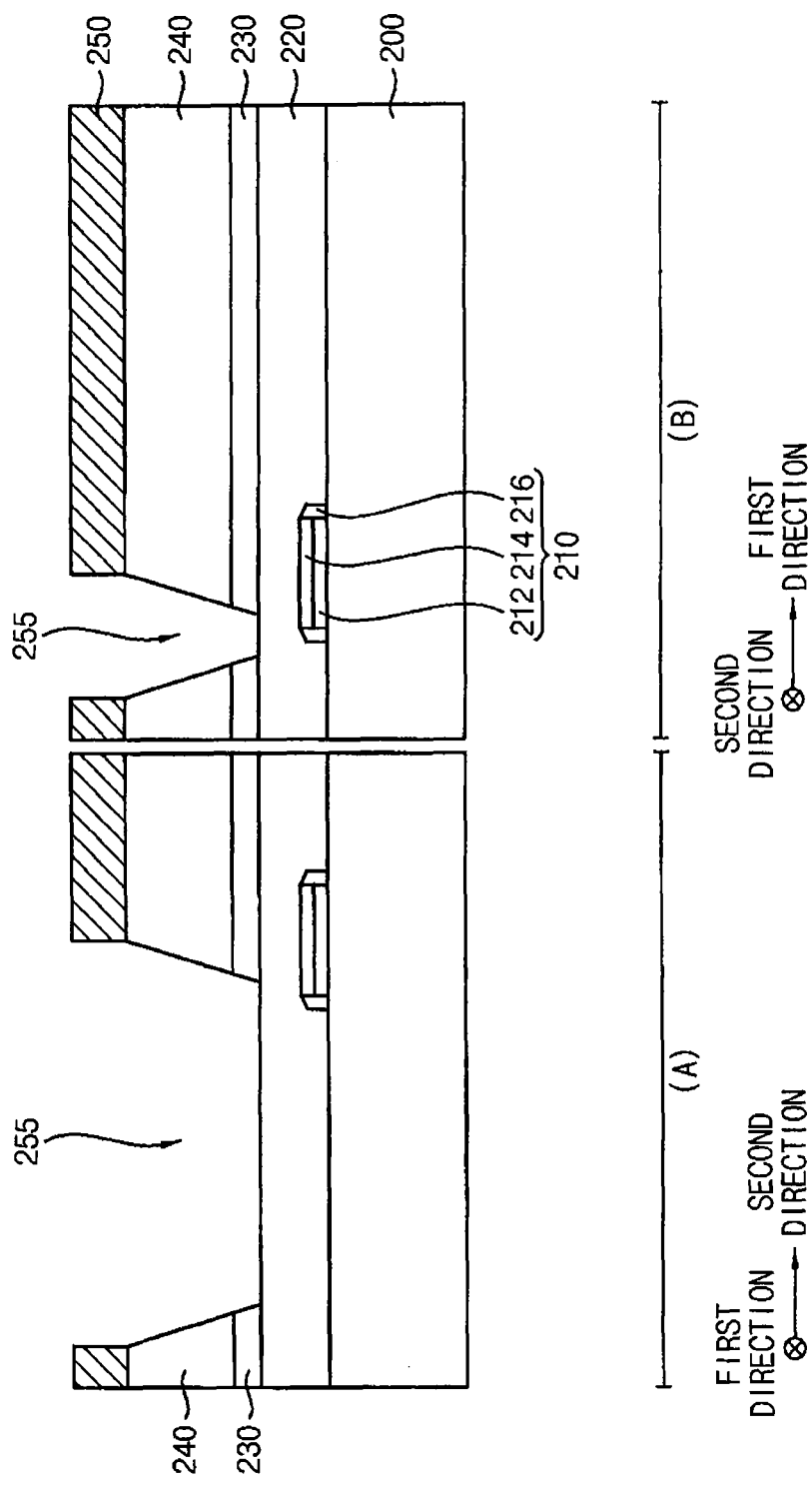
Figure 21:
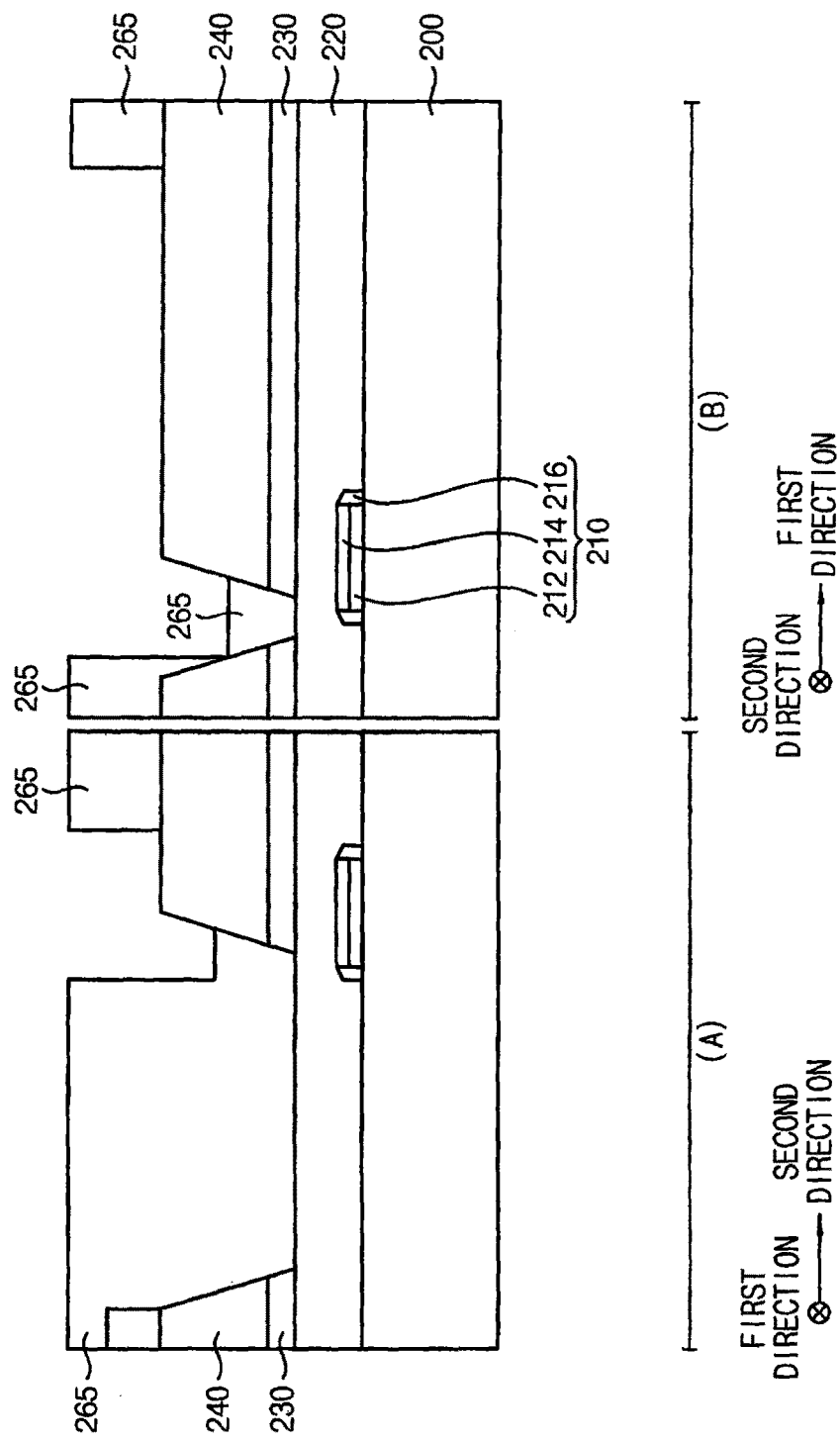
Figure 22:
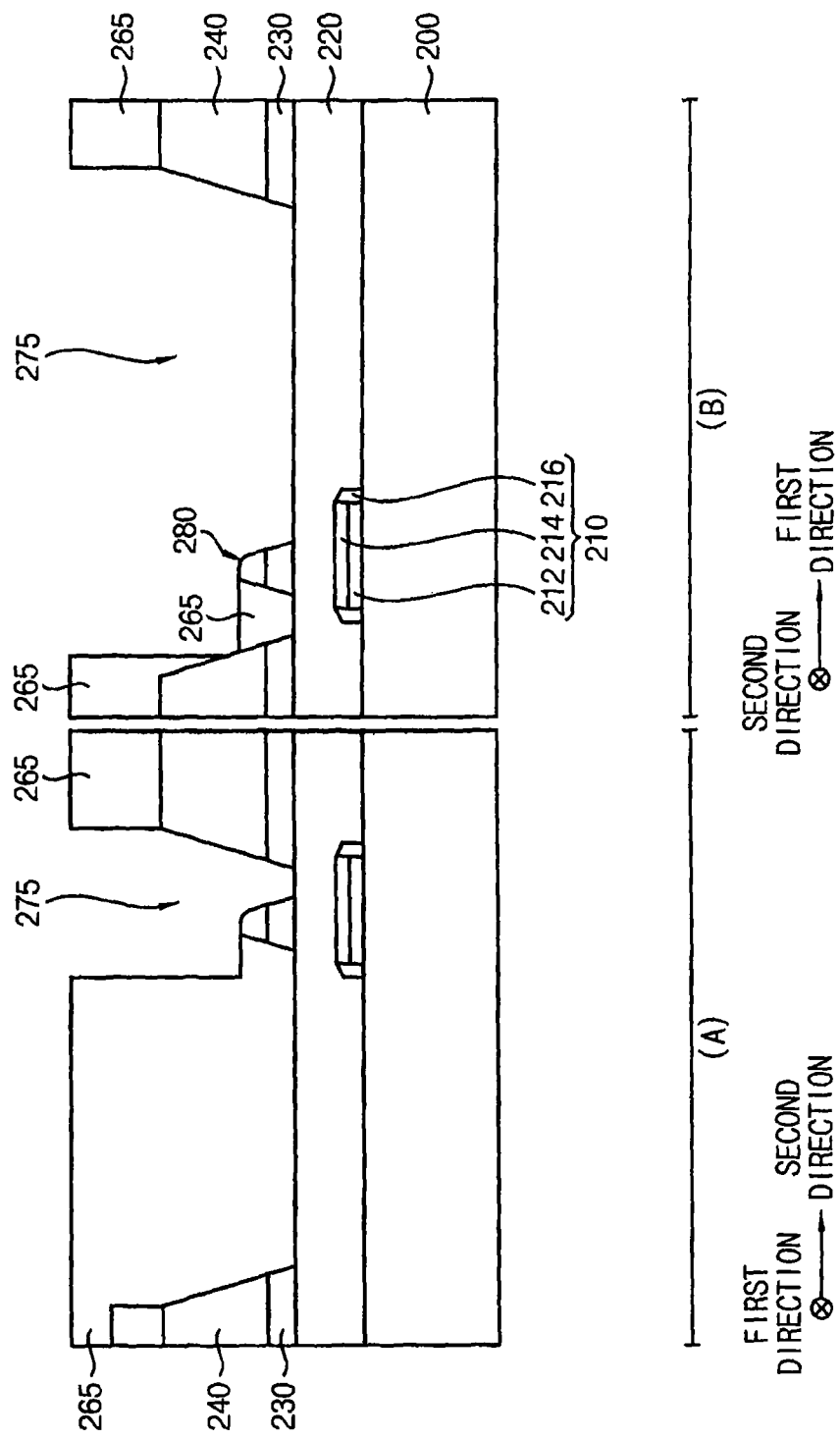

FIG. 19 is a plan view illustrating methods of forming a semiconductor device in accordance with some embodiments, and FIGS. 20 to 22 are cross-sectional views illustrating methods of forming a semiconductor device in accordance with some embodiments. For explanation, FIGS. 20 to 22 include cross-section views (A) cut along the lines VI-VI' of FIG. 19, and cross-section views (B) cut along the lines V-V' of FIG. 19, respectively.

Referring to FIG. 19, the semiconductor device may include a wiring structure having a plurality of conductive patterns. In some embodiments, the wiring structure may include a first conductive pattern 291, a second conductive pattern 292 and a third conductive pattern 293. Each of the first to the third conductive patterns 291, 292 and 293 may extend in a first direction and a second direction substantially perpendicular to the first direction, and the first to the third conductive patterns 291, 292 and 293 may be disposed adjacent to each other.

The conductive patterns 291, 292 and 293 may be formed by a damascene process. That is, after forming a second insulating interlayer 240 (See FIG. 20) on a substrate 200, the second insulation interlayer 240 may be partially removed to form trenches 255, 275, 276, 277, 278 and 279 (See FIGS. 19, 20 and 21). A conductive layer may be formed to fill the trenches 255, 275, 276, 277, 278 and 279, and then the conductive layer may be planarized to form conductive patterns 291, 292 and 293.

Due to the limited resolution of the optical patterning (photolithography) process used to form the trenches, the trenches for receiving the conductive patterns 291, 292 and 293 may be formed by a multi-patterning process instead of a single patterning process. For example, the trenches 255 and 276 extending in the first direction may be formed simultaneously by a single patterning process, however the trench 255 extending in the first direction and the trench 275 extending in the second direction may not be formed simultaneously by a single patterning process.

In some embodiments, the first to the third conductive patterns 291, 292 and 293 may extend in the first direction and the second direction, so that trenches for receiving the first to the third conductive patterns 291, 292 and 293 may not be formed simultaneously. Therefore, the first trench 255, the third trench 276 and the fifth trench 278 extending in the first direction may be formed simultaneously by one patterning process, and the second trench 275, the fourth trench 277 and the sixth trench 279 extending in the second direction may be formed simultaneously by another patterning process. Further, a patterning region for forming the first trench 255 and a patterning region for forming the second trench 275 may partially overlap to provide an alignment margin as discussed above.

A patterning region for forming the first trench 255 is defined as a first patterning region I, and a patterning region for forming the second trench 275 is defined as a second patterning region II. A patterning region in which the first patterning region I and the second patterning region II overlap is defined as a third patterning region III.

Processes substantially the same as or similar to those illustrated with reference to FIGS. 4 to 7 may be performed to form a first trench 255. In this case, the first mask 250 may expose the first patterning region for forming the first trench 255. The second insulating interlayer 240 and an etch stop layer 230 may be partially removed to form the first trench 255 extending in the first direction.

Referring to FIG. 21, processes substantially the same as or similar to those illustrated with reference to FIGS. 8 and 9 may be performed to form a second mask 265. The second mask 265 may expose the second patterning region for forming the second trench 275. Further, the second mask 265 may have a reduced thickness in the third patterning region where the first patterning region and the second patterning region overlap.

Referring to FIG. 22, the second insulating interlayer 240 and the etch stop layer 230 may be partially removed using the second mask 265, thereby forming the second trench 275. The second trench 275 may extend in the second direction, and may be fluid-communicated with the first trench 255. Further, the remaining insulation pattern structure 280 may be formed in the third patterning region. During the process for forming the second trench 275, portions of the second insulating interlayer 240 and the etch stop layer 230 may be covered by the second mask 265, so that the first insulating interlayer 220 under the second insulating interlayer 240 may not be over-etched.

Then, processes substantially the same as similar to those illustrated in FIG. 12 may be performed to complete the semiconductor device.

The foregoing description is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims.

What is claimed is:

1. A semiconductor device, comprising:
a gate structure on a substrate;
a first insulating layer on the substrate over the gate structure;
an insulation pattern structure on the first insulating layer above the gate structure, a width of the insulation pattern structure being less than a width of the gate structure and being gradually reduced as a height of the insulation pattern structure becomes higher, wherein the insulation pattern structure includes a first insulation pattern and a second insulation pattern sequentially stacked;
a conductive pattern on the first insulating layer and extending over the insulation pattern structure;
an etch stop layer on the first insulating layer, the etch stop layer partially surrounding a sidewall of the conductive pattern; and
a second insulating layer on the etch stop layer, the second insulating layer partially surrounding the sidewall of the conductive pattern.

2. A semiconductor device, comprising:
a gate structure on a substrate;
a first insulating layer on the substrate over the gate structure;
an insulation pattern structure on the first insulating layer above the gate structure, a width of the insulation pattern structure being less than a width of the gate structure and being gradually reduced as a height of the insulation pattern structure becomes higher, wherein the insulation pattern structure includes a first insulation pattern and a second insulation pattern sequentially stacked;
a conductive pattern on the first insulating layer and extending over the insulation pattern structure;
an etch stop layer on the first insulating layer, the etch stop layer partially surrounding a sidewall of the conductive pattern; and
a second insulating layer on the etch stop layer, the second insulating layer partially surrounding the sidewall of the conductive pattern,
wherein the first insulation pattern includes a material substantially the same as that of the etch stop layer, and wherein the second insulation pattern includes a material substantially the same as that of the second insulating layer.

3. The semiconductor device of claim 2, wherein the first insulation pattern includes silicon nitride, and wherein the second insulation pattern includes silicon oxide.

4. The semiconductor device of claim 1, further comprising a diffusion barrier between the first insulating layer and the conductive pattern.

5. The semiconductor device of claim 4, wherein the diffusion barrier extends between the insulation pattern structure and the conductive pattern.

6. The semiconductor device of claim 4, wherein the diffusion barrier comprises a metal nitride layer.

7. A semiconductor device, comprising:
a gate structure on a substrate;
a first insulating layer on the substrate over the gate structure;
an insulation pattern structure on the first insulating layer above the gate structure, a width of the insulation pattern structure being less than a width of the gate structure and being gradually reduced as a height of the insulation pattern structure becomes higher, wherein the insulation pattern structure includes a first insulation pattern and a second insulation pattern sequentially stacked;
a conductive pattern on the first insulating layer and extending over the insulation pattern structure;

an etch stop layer on the first insulating layer, the etch stop layer partially surrounding a sidewall of the conductive pattern; and a second insulating layer on the etch stop layer, the second insulating layer partially surrounding the sidewall of the conductive pattern, further comprising a diffusion barrier between the first insulating layer and the conductive pattern, wherein the diffusion barrier contacts sidewalls of the first insulation pattern, the second insulation pattern, the etch stop layer and the second insulating layer.

* * * * *